United States Patent
Morita et al.

(10) Patent No.: US 8,044,162 B2
(45) Date of Patent: Oct. 25, 2011

(54) ADHESION-PROMOTING AGENT, CURABLE ORGANOPOLYSILOXANE COMPOSITION, AND SEMICONDUCTOR DEVICE

(75) Inventors: Yoshitsugu Morita, Ichihara (JP); Tomoko Kato, Ichihara (JP); Hiroshi Ueki, Ichihara (JP); Osamu Tanaka, Sodegaura (JP)

(73) Assignee: Dow Corning Toray Company, Ltd., Chiyoda-ku, Tokyo (JP)

( * ) Notice: Subject to any disclaimer, the term of this patent is extended or adjusted under 35 U.S.C. 154(b) by 138 days.

(21) Appl. No.: 12/299,929

(22) PCT Filed: May 10, 2007

(86) PCT No.: PCT/JP2007/060092
§ 371 (c)(1),
(2), (4) Date: Mar. 23, 2009

(87) PCT Pub. No.: WO2007/132910
PCT Pub. Date: Nov. 22, 2007

(65) Prior Publication Data
US 2009/0294796 A1 Dec. 3, 2009

(30) Foreign Application Priority Data
May 11, 2006 (JP) .................. 2006-133143
Jun. 30, 2006 (JP) .................. 2006-182000

(51) Int. Cl.
*H01L 33/00* (2010.01)
*C08G 77/04* (2006.01)
(52) U.S. Cl. ......................... 528/32; 257/100
(58) Field of Classification Search .................. 257/100; 528/32
See application file for complete search history.

(56) References Cited

U.S. PATENT DOCUMENTS
4,082,726 A * 4/1978 Mine et al. ............... 528/31
(Continued)

FOREIGN PATENT DOCUMENTS
EP  0596534 A2  5/1994
(Continued)

OTHER PUBLICATIONS

English language abstract for JP 64085224 extracted from PAJ database, dated Apr. 13, 2009, 6 pages.
(Continued)

*Primary Examiner* — Robert Loewe
(74) *Attorney, Agent, or Firm* — Howard & Howard Attorneys PLLC

(57) ABSTRACT

An adhesion-promoting agent represented by the following average formula: $R^1_a SiO_{(4-a)/2}$ (where $R^1$ is a group selected from an optionally substituted alkyl group with 1 to 10 carbon atoms, an alkenyl group with 2 to 20 carbon atoms, an aryl group with 6 to 20 carbon atoms, an alkoxy group with 1 to 10 carbon atoms, or an epoxy-containing organic group; however, in one molecule, the content of the alkenyl groups should constitute at least 5 mole % of all groups designated by $R^1$; the content of the aryl groups should constitute at least 5 mole % of all groups designated by $R^1$; the content of the alkoxy groups should constitute at least 5 mole % of all groups designated by $R^1$; the content of the epoxy-containing organic groups should constitute at least 5 mole % of all groups designated by $R^1$; and "a" is a number that satisfies the following condition: $1.0 \leq a < 4$) is a novel adhesion-promoting agent, and a curable organopolysiloxane composition that contains the aforementioned adhesion-promoting agent, has excellent adhesion to various organic-resin substrates and suitable for forming a cured body having high refractive index and high light transmissivity.

9 Claims, 1 Drawing Sheet

U.S. PATENT DOCUMENTS

| | | | |
|---|---|---|---|
| 4,122,127 A * | 10/1978 | Mikami et al. | 525/477 |
| 4,157,357 A * | 6/1979 | Mine et al. | 528/31 |
| 4,245,079 A * | 1/1981 | Matsumoto et al. | 528/15 |
| 4,677,161 A * | 6/1987 | Suzuki et al. | 524/862 |
| 5,173,765 A * | 12/1992 | Nakayoshi et al. | 257/783 |
| 5,708,054 A * | 1/1998 | Mine et al. | 523/212 |
| 6,124,407 A * | 9/2000 | Lee et al. | 525/478 |
| 6,235,862 B1 * | 5/2001 | Isshiki et al. | 528/15 |
| 2004/0116640 A1 * | 6/2004 | Miyoshi | 528/12 |
| 2004/0241927 A1 * | 12/2004 | Kato et al. | 438/202 |
| 2007/0112147 A1 * | 5/2007 | Morita et al. | 525/478 |
| 2007/0134425 A1 * | 6/2007 | Morita et al. | 427/387 |

FOREIGN PATENT DOCUMENTS

| | | |
|---|---|---|
| EP | 0632099 A2 | 1/1995 |
| JP | 64085224 A | 3/1989 |
| JP | 04011634 A | 1/1992 |
| JP | 04178461 A | 6/1992 |
| JP | 06145525 A | 5/1994 |
| JP | 2005105217 A | 4/2005 |
| WO | WO 2004037927 A1 | 5/2004 |
| WO | WO 2005033207 A1 * | 4/2005 |
| WO | WO 2006011676 A1 | 2/2006 |

OTHER PUBLICATIONS

English language abstract for JP 04011634 extracted from PAJ database, dated Apr. 13, 2009, 8 pages.

English language abstract for JP 04178461 extracted from PAJ database, dated Apr. 13, 2009, 10 pages.

English language translation and abstract for JP 06145525 extracted from PAJ database, dated Apr. 13, 2009, 43 pages.

English language translation and abstract for JP 2005105217 extracted from PAJ database, dated Apr. 13, 2009, 64 pages.

PCT International Search Report for PCT/JP2007/060092, dated Aug. 29, 2007, 3 pages.

* cited by examiner

ADHESION-PROMOTING AGENT, CURABLE ORGANOPOLYSILOXANE COMPOSITION, AND SEMICONDUCTOR DEVICE

RELATED APPLICATIONS

This application claims priority to and all the advantages of International Patent Application No. PCT/JP2007/060092, filed on May 10, 2007, which claims priority to Japanese Patent Applications Nos. JP2006-133143, filed on May 11, 2006, and JP2006-182000, filed on Jun. 30, 2006.

TECHNICAL FIELD

The present invention relates to an adhesion-promoting agent, a curable organopolysiloxane composition, and a semiconductor device. More specifically, the invention relates to a novel adhesion-promoting agent, an organopolysiloxane composition that contains the aforementioned adhesion-promoting agent, and a semiconductor device that uses the aforementioned composition.

BACKGROUND ART

Usually, hydrosilylation-curable organopolysiloxane compositions have poor adhesion to substrates made from materials such as metals, organic resins, and especially from thermoplastic resins. Therefore, it was proposed to use an adhesion-promoting agent or a curable organopolysiloxane composition that contains an agent which is composed of an organopolysiloxane which has in its molecule a silicon atom bonded to an epoxy-containing organic group, an alkoxy group, an alkenyl group, or a univalent hydrocarbon group other than an alkenyl group (see Japanese Unexamined Patent Application Publications (hereinafter referred to as "Kokai") S64-85224). Other adhesion-promoting agents and curable organopolysiloxane compositions that contain aforementioned adhesion-promoting agents that comprise an organopolysiloxane having silicon-bonded alkoxy groups, alkenyl groups, or alkyl groups are disclosed in Kokai H04-11634, H04-178461 and H06-145525. Kokai 2005-105217 discloses a curable organopolysiloxane composition which is intended for sealing semiconductor elements and which consists of a linear-chained organopolysiloxane having alkenyl and aryl groups, a branch-chained organopolysiloxane having alkenyl and aryl groups, an organopolysiloxane having silicon-bonded hydrogen atoms and aryl groups, and a hydrosilylation catalyst. In other words, it is shown that adhesion-promoting agents that comprise organopolysiloxanes that contain epoxy-containing organic groups, alkoxy groups, alkenyl groups, and alkyl groups are known.

However, when the aforementioned curable organopolysiloxane compositions are used for adhesively connecting parts to substrates by thermal curing, in particular, to substrates made from metal, or organic resins, and especially to thermoplastic resins that have polar bonds, then, even at the initial stage of a thermal cycle the connected parts are subject to peeling from the substrate at the interface with the latter. Therefore, the use of such curable organopolysiloxanes for sealing semiconductor elements may reduce reliability of respective semiconductor devices.

It is an object of the present invention to provide a novel adhesion-promoting agent, a curable organopolysiloxane composition that contains the aforementioned adhesion-promoting agent and that possesses excellent adhesion to organic-resin substrates or the like, and is suitable for the formation of a cured body of high refractive index and high optical transmissivity. It is another object of the invention to provide a semiconductor device that uses the aforementioned composition and is characterized by high reliability.

DISCLOSURE OF INVENTION

An adhesion-promoting agent of the present invention is represented by the following average formula:

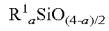

$$R^1_a SiO_{(4-a)/2}$$

(where $R^1$ is a group selected from an optionally substituted alkyl group with 1 to 10 carbon atoms, an alkenyl group with 2 to 20 carbon atoms, an aryl group with 6 to 20 carbon atoms, an alkoxy group with 1 to 10 carbon atoms, or an epoxy-containing organic group; however, in one molecule, the content of alkenyl groups should constitute at least 5 mole % of all groups designated by $R^1$; the content of aryl groups should constitute at least 5 mole % of all groups designated by $R^1$; the content of alkoxy groups should constitute at least 5 mole % of all groups designated by $R^1$; the content of epoxy-containing organic groups should constitute at least 5 mole % of all groups designated by $R^1$; and "a" is a number that satisfies the following condition: $1.0 \leq a < 4.0$).

A curable organopolysiloxane composition of the invention comprises at least the following components:

100 parts by weight of an organopolysiloxane (A) of the following average formula:

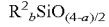

$$R^2_b SiO_{(4-a)/2}$$

(where $R^2$ is an optionally substituted univalent hydrocarbon groups with 1 to 10 carbon atoms; however, in one molecule, at least two $R^2$'s are univalent hydrocarbon groups having unsaturated aliphatic bonds; at least 20 mole % of all $R^2$'s are aryl groups; and "b" is a number that satisfies the following condition: $0.5 \leq b \leq 2.2$);

an organohydrogenpolysiloxane (B) of the following average formula:

$$R^3_c H_d SiO_{(4-c-d)/2}$$

(where $R^3$ is an optionally substituted univalent hydrocarbon group having 1 to 10 carbon atoms and free of unsaturated aliphatic bonds, and where "c" and "d" are numbers that satisfy the following conditions: $1.0 < c < 2.2$; $0.002 < d < 1$; and $1.0 < c+d < 3.0$) {component (B) is contained in such an amount that the mole ratio of silicon-bonded hydrogen atoms contained in this component to univalent hydrocarbon groups with unsaturated aliphatic bonds contained in component (A) is in the range of 0.3 to 5};

0.01 to 50 parts by weight of an adhesion-promoting agent (C) represented by the following average formula:

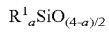

$$R^1_a SiO_{(4-a)/2}$$

(where $R^1$ is a group selected from an optionally substituted alkyl group with 1 to 10 carbon atoms, an alkenyl group with 2 to 20 carbon atoms, an aryl group with 6 to 20 carbon atoms, an alkoxy group with 1 to 10 carbon atoms, or an epoxy-containing organic group; however, in one molecule, the content of alkenyl groups should constitute at least 5 mole % of all groups designated by $R^1$; the content of aryl groups should constitute at least 5 mole % of all groups designated by $R^1$; the content of alkoxy groups should constitute at least 5 mole % of all groups designated by $R^1$; the content of epoxy-containing organic groups should constitute at least 5 mole % of all groups designated by $R^1$; and "a" is a number that satisfies the following condition: $1.0 \leq a < 4.0$); and a hydrosilylation catalyst (D) in a catalytic quantity.

A semiconductor device of the present invention has semiconductor elements which are sealed with a cured body of the aforementioned curable organopolysiloxane composition.

EFFECTS OF INVENTION

An adhesion-promoting agent of the invention is a novel compound, and when a curable organopolysiloxane composition of the invention contains this adhesion-promoting agent, it may form a cured body that is characterized by excellent adhesion to organic-resin substrates from the initial stage of adhesion. The aforementioned cured body is also characterized by excellent adhesion durability, high refractive index, and high light transmissivity. A semiconductor device of the invention is characterized by excellent reliability resulting from the use of a cured body of the aforementioned curable organopolysiloxane composition.

REFERENCE NUMBERS

Figure 1:
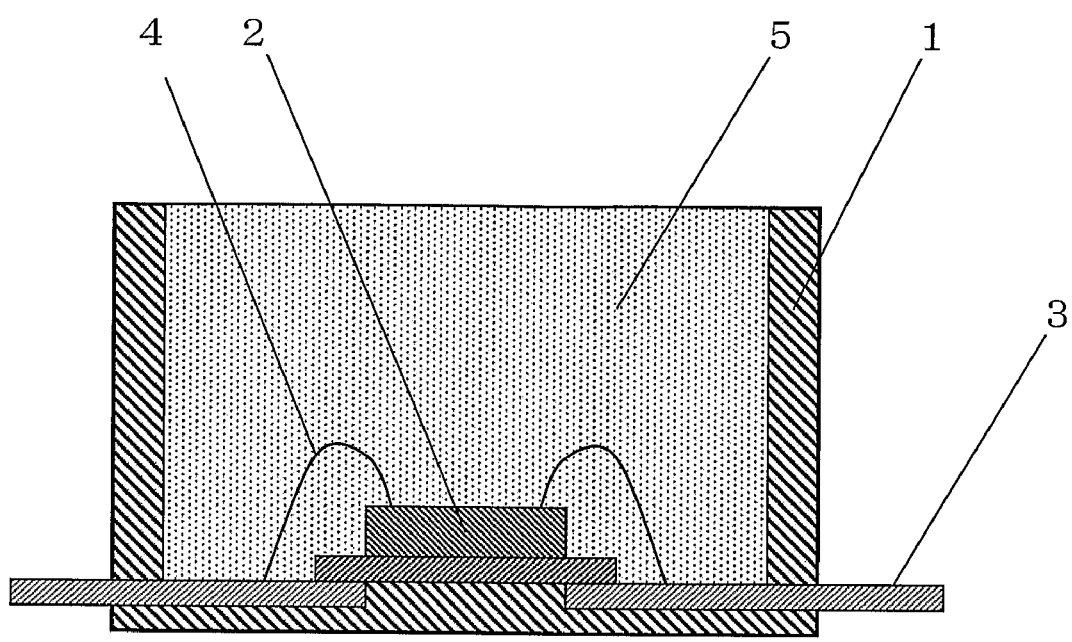
FIG. 1 is a sectional view of a surface-mount light-emitting diode (LED) made in accordance with one embodiment of the invention.

1: resin-made casing
2: LED chip
3: inner lead
4: bonding wire
5: cured body of the curable organopolysiloxane composition

DETAILED DESCRIPTION OF THE INVENTION

The following is a detailed description of the adhesion-promoting agent of the invention.

The adhesion-promoting agent of the invention is represented by the following average formula:

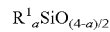

In this formula, $R^1$ is a group selected from an optionally substituted alkyl group with 1 to 10 carbon atoms, an alkenyl group with 2 to 20 carbon atoms, an aryl group with 6 to 20 carbon atoms, an alkoxy group with 1 to 10 carbon atoms, or an epoxy-containing organic group. Alkyl groups designated by $R^1$ may be exemplified by methyl, ethyl, propyl, isopropyl, butyl, isobutyl, t-butyl, pentyl, hexyl, cyclohexyl, heptyl, octyl, nonyl, decyl, and 3,3,3-trifluoropropyl groups. Most preferable of these are methyl and ethyl groups. Alkenyl groups designated by $R^1$ may be exemplified by vinyl, allyl, propenyl, isopropenyl, butenyl, isobutenyl, pentenyl, heptenyl, hexenyl, and cyclohexenyl groups. Most preferable of these are vinyl, allyl, and hexenyl groups. Aryl groups designated by $R^1$ may be exemplified by phenyl, tolyl, xylyl, and naphthyl groups, of which most preferable are phenyl groups. Alkoxy groups designated by $R^1$ may be exemplified by methoxy, ethoxy, propoxy, and butoxy groups. Most preferable are methoxy and ethoxy groups. Epoxy-containing organic groups designated by $R^1$ may be exemplified by 2-glycidoxyethyl, 3-glycidoxy propyl, 4-glycidoxy butyl, or similar glycidoxy alkyl groups; 2-(3,4-epoxycyclohexyl)-ethyl, 3-(3,4-epoxycyclohexyl)-propyl, or similar epoxycyclohexyl alkyl groups; 4-oxiranyl butyl, 8-oxiranyl octyl, or similar oxiranyl alkyl groups. Preferable are glycidoxy alkyl groups, and most preferable is 3-glycidoxypropyl.

The content of the aforementioned alkenyl groups in the adhesion-promoting agent of the invention constitutes at least 5 mole %, preferably 5 to 50 mole %, of all groups designated by $R^1$. The content of the aforementioned aryl groups in the adhesion-promoting agent of the invention constitutes at least 5 mole %, preferably at least 10 mole %, of all groups designated by $R^1$. The content of the aforementioned alkoxy groups in the adhesion-promoting agent of the invention constitutes at least 5 mole % of all groups designated by $R^1$. The content of the aforementioned epoxy-containing organic groups in the adhesion-promoting agent of the invention constitutes at least 5 mole %, preferably 5 to 50 mole %, of all groups designated by $R^1$.

In the above formula, "a" is a number that should satisfy the following condition: $1.0 \leq a < 4.0$, preferably the following condition: $1.0 \leq a \leq 3.5$, most preferably, the following condition: $2.0 \leq a \leq 3.0$, and even further preferably, the following condition: $2.2 \leq a \leq 2.6$. If the value of "a" is below the recommended lower limit, this will impair properties of the adhesion-promoting agent. If, on the other hand, the value of "a" exceeds the recommended upper limit, this will reduce the molecular weight of the adhesion-promoting agent and will cause exudation of the agent from the composition or from the cured body of the composition that contains the aforementioned agent. It is recommended that the adhesion-promoting agent be liquid at room temperature. Its mass-average molecular weight should be in the range of 500 to 5,000, preferably 700 to 3,000. Viscosity of the adhesion-promoting agent should be in the range of 1 to 10,000 mPa·s at 25° C.

It is recommended that the adhesion-promoting agent of the invention comprise an organopolysiloxane that is composed of 1 to 20 mole % of siloxane units represented by the following general formula:

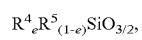

20 to 80 mole % of siloxane units represented by the following general formula:

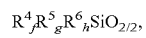

and 20 to 80 mole % of siloxane units represented by the following general formula:

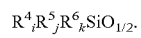

In the above formulae, $R^4$ is an alkenyl group with 2 to 20 carbon atoms, and may be represented by the following specific examples: vinyl, allyl, propenyl, isopropenyl, butenyl, isobutenyl, pentenyl, heptenyl, hexenyl, and cyclohexenyl group. Most preferable of these are vinyl, ally, and hexenyl groups. $R^5$ designates a group selected from an optionally substituted alkyl with 1 to 10 carbon atoms, an aryl with 6 to 20 carbon atoms, or an epoxy-containing organic group. An alkyl group designated by $R^5$ may be exemplified by a methyl, ethyl, propyl, isopropyl, butyl, isobutyl, t-butyl, pentyl, hexyl, cyclohexyl, heptyl, octyl, nonyl, decyl, and a 3,3,3-trifluoropropyl group. An aryl group designated by $R^5$ may be exemplified by a phenyl, tolyl, xylyl, and a naphthyl group. An epoxy-containing organic group designated by $R^5$ may be exemplified by 2-glycidoxy ethyl, 3-glycidoxy propyl, 4-glycidoxy butyl, or a similar glycidoxy alkyl group; 2-(3,4-epoxycyclohexyl)-ethyl, 3-(3,4-epoxycyclohexyl)-propyl, or a similar epoxycyclohexyl alkyl group; 4-oxiranyl butyl, 8-oxiranyl octyl, or a similar oxiranyl alkyl group. $R^6$ designates an alkoxy group with 1 to 10 carbon atoms that may be exemplified by a methoxy, ethoxy, propoxy, and a butoxy group. Preferable are methoxy and ethoxy groups. From the viewpoint of adhesive properties of a cured body, the methoxy group is most preferable. However, among the sum of all groups designated by $R^4$, $R^5$, and $R^6$, the alkenyl groups should constitute at least 5 mole %, the aryl groups should constitute at least 5 mole %, the alkoxy groups should constitute at least 5 mole %, and the epoxy-containing organic groups also should constitute at least 5 mole %. In the above formulae, "e" is 0 or 1, "f" is 0 or 1, and "g" is an integer in the range of 0 to 2; "h" is 0 or 1; f+g+h=2; "i" is 0 or 1, "j" is an integer in the range of 0 to 3; "k" is an integer in the range of 0 to 2; and i+j+k=3.

The adhesion-promoting agent of the invention can be prepared by causing an equilibration reaction between a siloxane oligomer having alkenyl groups, an organopolysiloxane having phenyl groups, and an alkoxysilane having epoxy-containing organic groups in the presence of potassium hydroxide, sodium hydroxide, lithium hydroxide, or a similar alkali-metal hydroxide; an alkali metal alcoholate of a dimethylpolysiloxane or a methylphenylpolysiloxane, or a similar alkali metal alcoholate; triethylamine, or similar amines; tetramethyl ammonium hydroxide, or a similar ammonium hydroxide.

The aforementioned adhesion-promoting agent can be included for fulfilling its adhesion-promoting function into a hydrosilylation-curable organopolysiloxane composition, a condensation-curable organopolysiloxane composition, a peroxide-curable organopolysiloxane composition, or a UV-curable organopolysiloxane composition. The best results are obtained when the adhesion-promoting agent is combined with a hydrosilylation-curable organopolysiloxane composition.

The following description relates to a curable organopolysiloxane composition of the invention.

A curable organopolysiloxane composition of the invention comprises at least the following components:

100 parts by weight of an organopolysiloxane (A) of the following average formula:

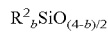

(where $R^2$ is an optionally substituted univalent hydrocarbon groups with 1 to 10 carbon atoms; however, in one molecule, at least two $R^2$'s are univalent hydrocarbon groups having unsaturated aliphatic bonds; at least 20 mole % of all $R^2$'s are aryl groups; and "b" is a number that satisfies the following condition: $0.5 \leq b \leq 2.2$);

an organohydrogenpolysiloxane (B) of the following average formula:

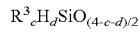

(where $R^3$ is an optionally substituted univalent hydrocarbon group having 1 to 10 carbon atoms and free of unsaturated aliphatic bonds, and where "c" and "d" are numbers that satisfy the following conditions: $1.0 < c < 2.2$; $0.002 < d < 1$; and $1.0 < c+d < 3.0$) {component (B) is contained in such an amount that the mole ratio of silicon-bonded hydrogen atoms contained in this component to univalent hydrocarbon groups with unsaturated aliphatic bonds contained in component (A) is in the range of 0.3 to 5};

0.01 to 50 parts by weight of an adhesion-promoting agent (C) represented by the following average formula:

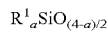

(where $R^1$ is a group selected from an optionally substituted alkyl group with 1 to 10 carbon atoms, an alkenyl group with 2 to 20 carbon atoms, an aryl group with 6 to 20 carbon atoms, an alkoxy group with 1 to 10 carbon atoms, or an epoxy-containing organic group; however, in one molecule, the content of the alkenyl groups should constitute at least 5 mole % of all groups designated by $R^1$; the content of the aryl groups should constitute at least 5 mole % of all groups designated by $R^1$; the content of the alkoxy groups should constitute at least 5 mole % of all groups designated by $R^1$; the content of the epoxy-containing organic groups should constitute at least 5 mole % of all groups designated by $R^1$; and "a" is a number that satisfies the following condition: $1.0 \leq a < 4.0$); and a hydrosilylation catalyst (D) in a catalytic quantity.

Component (A), which is one of the main components of the composition of the invention, is an organopolysiloxane represented by the following average formula:

There are no special restrictions with regard to a molecular structure of component (A), and this component may have a linear, partially branched linear, branched, or a net-like molecular structure. In the above formula, $R^2$ designates an optionally substituted univalent hydrocarbon group with 1 to 10 carbon atoms. Such a group may be exemplified by methyl, ethyl, propyl, isopropyl, butyl, isobutyl, t-butyl, pentyl, hexyl, cyclohexyl, heptyl, octyl, nonyl, decyl, or a similar alkyl group; vinyl, allyl, propenyl, isopropenyl, butenyl, isobutenyl, pentenyl, heptenyl, hexenyl, cyclohexenyl group, or a similar alkenyl group; phenyl, tolyl, xylyl, naphthyl, or a similar aryl group; a benzyl, phenethyl, or a similar aralkyl group; and 3-chloropropyl, 2-bromoethyl, 3,3,3-trifluoropropyl, or a similar halogenated alkyl group. In one molecule, at least two groups designated by $R^2$ are univalent hydrocarbon groups having unsaturated aliphatic bonds. Most preferable of the above groups are alkenyl groups, in particular, vinyl, allyl, and hexenyl groups. In one molecular, at least 20 mole % of all groups designated by $R^2$ are aryl groups, preferably phenyl groups. In the above formula, "b" is a number that satisfies the following condition: $0.5 \leq b \leq 2.2$.

Aforementioned component (A) may be a mixture of an organopolysiloxane ($A_1$) represented by the following average formula:

(where $R^2$ is an optionally substituted univalent hydrocarbon group with 1 to 10 carbon atoms; however, in one molecule, at least two groups designated by $R^2$ are univalent hydrocarbon groups having unsaturated aliphatic bonds; at least 20 mole % of all $R^2$'s are aryl groups; and "b'" is a number that satisfies the following condition: $1.9 \leq b' \leq 2.2$) and an organopolysiloxane ($A_2$) of the following average formula:

(where $R^2$ is the same as defined above, and "b''" is a number that satisfies the following condition: $0.5 \leq b'' \leq 1.7$).

Constituent ($A_1$) is an organopolysiloxane of the following average formula:

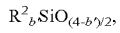

which has a linear, partially branched linear, or a branched molecular structure. At a temperature of 25° C., this component is liquid or is in the form of an uncured rubber. It is recommended that this constituent have a viscosity of 10 to 10,000,000 mPa·s, preferably 100 to 1,000,000 mPa·s, and most preferably 100 to 100,000 mPa·s at 25° C. In the above formula, $R^2$ may designate an optionally substituted univalent hydrocarbon group with 1 to 10 carbon atoms. This group can be exemplified by a methyl, ethyl, propyl, isopropyl, butyl, isobutyl, t-butyl, pentyl, hexyl, cyclohexyl, heptyl, octyl, nonyl, decyl, or a similar alkyl group; vinyl, allyl, propenyl, isopropenyl, butenyl, isobutenyl, hexenyl, cyclohexenyl group, or a similar alkenyl group; phenyl, tolyl, xylyl, naphthyl, or a similar aryl group; a benzyl, phenethyl, or a similar aralkyl group; and 3-chloropropyl, 2-bromoethyl, 3,3,3-trifluoropropyl, or a similar halogenated alkyl group. In one molecule, at least two groups designated by $R^2$ are univalent hydrocarbon groups having unsaturated aliphatic bonds. Most preferable of the above groups are alkenyl groups, in particular, vinyl, allyl, and hexenyl groups. From the viewpoint of improved physical strength and high index of refraction in a cured body, it is recommended that aryl groups constitute at least 20 mole % of all groups designated by $R^2$, and preferably that aryl groups constitute at least 40 mole % of all groups designated by $R^2$.

Aforementioned constituent $(A_1)$ can be exemplified by a methylphenylpolysiloxane capped at both molecular terminals with dimethylvinylsiloxy groups, a copolymer of a methylphenylsiloxane and dimethylsiloxane capped at both molecular terminals with dimethylvinylsiloxy groups, a copolymer of a methylvinylsiloxane and a methylphenylsiloxane capped at both molecular terminals with dimethylvinylsiloxy groups, a copolymer of a methylvinylsiloxane and diphenylsiloxane capped at both molecular terminals with dimethylvinylsiloxy groups, a copolymer of a methylvinylsiloxane, methylphenylsiloxane, and dimethylsiloxane capped at both molecular terminals with dimethylvinylsiloxy groups, a copolymer of a methylvinylsiloxane and a methylphenylsiloxane capped at both molecular terminals with trimethylsiloxy groups, a copolymer of a methylvinylsiloxane and diphenylsiloxane capped at both molecular terminals with trimethylsiloxy groups, and a copolymer of a methylvinylsiloxane, methylphenylsiloxane, and a dimethylsiloxane capped at both molecular terminals with trimethylsiloxy groups.

On the other hand, constituent $(A_2)$ is an organopolysiloxane that has a branched or a net-like molecular structure and is represented by the following average formula:

$$R^2_{b''}SiO_{(4-b'')/2}$$

At 25° C., this constituent may be in a liquid or in a solid form. In the above formula, $R^2$ designates an optionally substituted univalent hydrocarbon with 1 to 10 carbon atoms. These groups are the same as mentioned in respective examples above. In one molecule, at least two $R^2$'s are univalent hydrocarbon groups with unsaturated aliphatic bonds. Preferable are alkenyl groups, especially vinyl, allyl, and hexenyl groups. From the viewpoint of high index of refraction, it is recommended that at least 20 mole %, preferably 40 mole %, of all groups designated by $R^2$ be aryl groups; "b''" is a number that satisfies the following condition: $0.5 \leq b'' \leq 1.7$.

Aforementioned constituent $(A_2)$ comprises an organopolysiloxane that may be composed of the following siloxane units:

siloxane units (so called M units) represented by general formula: $R^2_3SiO_{1/2}$, siloxane units (so called D units) represented by general formula: $R^2_2SiO_{2/2}$, siloxane units (so called T units) represented by general formula: $R^2SiO_{3/2}$, and siloxane units (so called Q units) represented by general formula: $SiO_{4/2}$.

This constituent may be exemplified by an organopolysiloxane that is composed only of aforementioned T units, an organopolysiloxane that is composed of T units in combination with other aforementioned siloxane units, or an organopolysiloxane composed of Q units in combination with other aforementioned siloxane units. In the formulae of the above units, $R^2$ designates optionally substituted univalent hydrocarbon groups having 1 to 10 carbon atoms, which can be exemplified by the same groups of this type as above. However, in one molecule, at least two groups designated by $R^2$ are univalent hydrocarbon groups having unsaturated aliphatic bonds; at least 20 mole % of all $R^2$'s are aryl groups. Other groups may comprise silanol groups and alkoxy group which should be contained in small quantities.

As has been mentioned above, component (A) is a mixture of constituents $(A_1)$ and $(A_2)$. It is recommended to use constituent $(A_1)$ in an amount of 30 to 99 mass %, preferably 40 to 90 mass %, and constituent $(A_2)$ in an amount of 1 to 70 mass %, preferably 10 to 60 mass %.

Component (B), which is a cross-linking agent of component (A), is an organopolysiloxane represented by the following average formula:

$$R^3_cH_dSiO_{(4-c-d)/2}$$

In the above formula, $R^3$ is an optionally substituted univalent hydrocarbon group having 1 to 10 carbon atoms and free of unsaturated aliphatic bonds. The aforementioned univalent hydrocarbon group can be exemplified by methyl, ethyl, propyl, isopropyl, butyl, isobutyl, t-butyl, pentyl, hexyl, cyclohexyl, heptyl, octyl, nonyl, decyl, or a similar alkyl group; a phenyl, tolyl, xylyl, naphthyl, or a similar aryl group; benzyl, phenethyl, or a similar aralkyl group; and 3-chloropropyl, 2-bromoethyl, 3,3,3-trifluoropropyl, or a similar halogenated alkyl group. In the above formula, $R^3$ may represent only an alkyl group, in particular, only a methyl group, or an alkyl group and aryl group, in particular, a methyl group and a phenyl group. The greater is the amount of phenyl groups in one molecule, the higher is index of refraction and light transmissivity. Therefore, it is recommended that the amount of phenyl groups be no less that 5 mole %, preferably no less than 10 mole % of all groups designated by $R^3$. In the above formulae, "c" and "d" are numbers that satisfy the following conditions: $1.0 < c < 2.2$; $0.002 < d < 1$; and $1.0 < c+d < 3.0$; "d" is a number that satisfies the following condition: $0.002 < d < 1$. From the view point of better reactivity with component (A), the following condition may be recommended: $0.02 < d < 1$.

There are no special limitations with regard to the molecular structure of component (B), and this component may have a linear, partially branched linear, branched, cyclic, or a net-like molecular structure. For better miscibility with component (A), it is recommended that this component be in a liquid form at 25° C. Silicon-bonded hydrogen atoms of this component may assume positions on the molecular terminals, in the main chain, or can be in both positions at the same time. A number of silicon-bonded atoms in one molecule can be in the range of 3 to 500, preferably 3 to 10.

There are no special restrictions with regard to viscosity of component (B), but in order to facilitate handling of the obtained composition and to improve physical properties of a cured body obtained by curing the composition, it is recommended that viscosity be in the range of 1 to 1,000,000 mPa·s, and preferably 1 to 10,000 mPa·s at 25° C. In order to increase reactivity of component (B), it is even more preferable to provide viscosity in the range of 1 to 500 mPa·s at 25° C.

Aforementioned component (B) can be exemplified by the following compounds: a dimethylpolysiloxane capped at both molecular terminals with dimethylhydrogensiloxy groups; a copolymer of methylhydrogensiloxane and dimethylsiloxane capped at both molecular terminals with dimethylhydrogensiloxy groups; a copolymer of methylphenylsiloxane and dimethylsiloxane capped at both molecular terminals with dimethylhydrogensiloxy groups; a methylphenylpolysiloxane capped at both molecular terminals with dimethylhydrogensiloxy groups; a methylhydrogenpolysiloxane capped at both molecular terminals with trimethylsiloxy groups, a copolymer of methylhydrogensiloxane and dimethylsiloxane capped at both molecular terminals with trimethylsiloxy groups; and a copolymer of methylhydrogensiloxane and methylphenylsiloxane capped at both molecular terminals with trimethylsiloxy groups.

Component (B) is contained in the composition of the invention in such an amount that the mole ratio of silicon-bonded hydrogen atoms contained in this component to univalent hydrocarbon groups with unsaturated aliphatic bonds contained in component (A) is in the range of 0.3 to 5, preferably in the range of 0.6 to 3. If the content of component (B) is below the recommended lower limit, the composition will be insufficiently cured, and, if, on the other hand, the content of component (B) exceeds the recommended upper limit, this will reduce the thermal resistance of a cured body obtained from the composition.

Component (C), which is an adhesion-promoting agent, is represented by the following average formula:

$$R^1_a SiO_{(4-a)/2}$$

In this formula, $R^1$ is a group selected from an optionally substituted alkyl group with 1 to 10 carbon atoms, an alkenyl group with 2 to 20 carbon atoms, an aryl group with 6 to 20 carbon atoms, an alkoxy group with 1 to 10 carbon atoms, or an epoxy-containing organic group. These groups are the same as appropriate groups exemplified above. The content of the alkenyl groups contained in one molecule of component (C) should constitute at least 5 mole %, preferably 5 to 50 mole %, of all groups designated by $R^1$. The content of the aryl groups should constitute at least 5 mole %, preferably at least 10 mole % of all groups designated by $R^1$. The content of the alkoxy groups should constitute at least 5 mole % of all groups designated by $R^1$. The content of the epoxy-containing organic groups should constitute at least 5 mole %, preferably 5 to 50 mole %, of all groups designated by $R^1$. In the above formula, "a" is a number that should satisfy the following condition: $1.0 \leq a < 4$. For the same reasons as described earlier, it is recommended that the value of "a" satisfy the following condition: $1.0 \leq a \leq 3.5$, preferably, $2.0 \leq a \leq 3.0$, and most preferably, $2.2 \leq a \leq 2.6$. Component (C) is prepared by the same method as described above.

Component (C) should be used in the composition of the invention in an amount of 0.01 to 50 parts by mass, preferably 0.05 to 10 parts by mass, per 100 parts by mass of component (A). If component (C) is used in an amount less than the recommended lower limit, this will impair adhesion of the obtained composition to a substrate during curing. If, on the other hand, the content of component (C) exceeds the recommended upper limit, this will reduce either thermal resistance or the physical strength of a product obtained by curing the composition.

Component (D) is a hydrosilylation catalyst that is used for curing the composition and accelerates a hydrosilylation reaction between the silicon-bonded hydrogen atoms of component (B) and the univalent hydrocarbon groups with unsaturated aliphatic bonds which are contained in component (A). Component (D) can be represented by platinum-type catalysts, rhodium-type catalyst, and palladium-type catalysts. Most preferable are platinum-type catalysts which have a very high curing-acceleration effect. The following are examples of platinum-type catalysts: platinum black, chloroplatinic acid, alcohol-modified chloroplatinic acid, olefin complex of platinum, bis(acetoacetate) complex of platinum, carbonyl complex of platinum, bis(acetylacetonate) complex of platinum, divinyltetramethyldisiloxane complex of chloroplatinic acid, alkenylsiloxane complex of platinum, divinyltetramethyldisiloxane complex of platinum, and complexes of acetylen alcohols with chloroplatinic acid. Most preferable is an alkenylsiloxane complex of platinum. The aforementioned alkenylsiloxane can be exemplified by 1,3-divinyl-1,1,3,3-tetramethyldisiloxane, 1,3,5,7-tetramethyl-1, 3,5,7-tetravinyl cyclotetrasiloxane, the aforementioned alkenylsiloxanes having a part of their methyl groups substituted with ethyl groups, phenyl groups, etc., the aforementioned alkenylsiloxanes wherein the vinyl groups are substituted by allyl groups, hexenyl groups, or the like. Alkenylsiloxane complexes of platinum most preferable from the viewpoint of complex stability are 1,3-divinyl-1,1,3,3-tetramethyldisiloxane. In order to improve the stability of the aforementioned alkenylsiloxane complexes of platinum, they may be additionally combined with 1,3-divinyl-1,1,3,3-tetramethyldisiloxane, 1,3-diallyl-1,1,3,3-tetramethyldisiloxane, 1,3-divinyl-1,3-dimethyl-1,3-diphenyldisiloxane, 1,3-divinyl-1,1,3, 3-tetraphenyldisiloxane, 1,3,5,7-tetramethyl-1,3,5,7-tetravinylcyclotetrasiloxane, or similar alkenylsiloxanes or dimethylsiloxane oligomers, or other organosiloxane oligomers. Most preferable additives of this type are alkenylsiloxanes.

Component (D) is added to the composition of the invention in a catalytic quantity. For example, if the catalyst of component (D) is a platinum-type catalyst, it should be added to the composition, in terms of mass units, in an amount such that the content of platinum atoms in the composition is in the range of 0.1 to 1,000 ppm, preferably, 0.1 to 500 ppm. If component (D) is used in an amount less than the recommended lower limit, the composition will not be sufficiently cures, and if, on the other hand, the content of component (D) exceeds the recommended upper limit, a cured product obtained by curing the composition will be colored.

Within the limits which are not contradictory to the object of the present invention, the composition may be compounded with arbitrary compounds for use as hydrosilylation reaction inhibitors. Such inhibitors can be exemplified by 2-methyl-3-butyn-2-ol, 3,5-dimethyl-1-hexyn-3-ol, 2-phenyl-3-butyn-2-ol, or a similar alkyne alcohol; 3-methyl-3-penten-1-yne, 3,5-dimethyl-3-hexen-1-yne, or a similar enyne compound; 1,3,5,7-tetramethyl-1,3,5,7-tetravinylcyclotetrasiloxane, 1,3,5,7-tetramethyl-1,3,5,7-tetrahexenylcyclotetrasiloxane, benzotriazole or a similar curing inhibitor. There are no special restrictions regarding the amount in which these inhibitors can be used, but it can be recommended to add them in an amount of 0.001 to 6 parts by mass per 100 parts by mass of the sum of aforementioned components (A) through (D).

Within the limits which are not contradictory to the object of the present invention, the composition may be compounded with other arbitrary compounds, such as fumed silica, baked silica, wet-process silica, quartz powder, titanium oxide, fumed titanium oxide, calcium carbonate, iron oxide, zinc oxide, aluminum hydroxide, or similar inorganic fillers; aluminum oxide, silicon nitride, boron nitride, diamond powder, or similar heat-conductive fillers; copper powder, gold powder, silver powder, nickel powder, gold-coated copper powder, conductive carbon black, or similar electrically conductive fillers; carbon black, bengala, titanium oxide, or similar pigments; toluene, xylene, hexane, heptane, methylethylketone, acetone, ethanol, isopropyl alcohol, or similar organic solvents; dyes, etc.

At room temperature, the composition of the invention may be in the form of a liquid or gum. It may be flowable at room temperature or when heated. When the composition is cured, it can be turned into an elastomer having a hardness of 15 to 80 measured by a type A durometer in accordance with JIS K 6253-1997 (Hardness Testing Method for Vulcanized Rubber and Thermoplastic Rubber). Since, as a result of curing the composition strongly adheres to various substrates such as substrates made from thermoplastic resin with polar bonds, thermosetting resins, or similar organic resins, metal, inorganic semiconductors, ceramic, and glass, and since the composition possesses excellent adhesion durability, it may find application as a sealant, adhesive agent, bonding agent, protective coating agent, underfiller, or the like, for parts of electronic instruments, electronic devices, electrical devices, etc. In particular, since cured bodies of the composition have a high refractive index that at 25° C. exceeds 1.45 and even 1.50 and a cured body of which has transmissivity exceeding 90 to 100%, the composition is suitable for application as a transparent sealant, adhesive agent, bonding agent, protective coating agent, underfiller, etc., of optical semiconductors.

The following is a more detailed description of a semiconductor device of the invention.

A semiconductor device of the invention is characterized by the fact that a semiconductor element thereof is sealed with a cured body of the aforementioned curable organopolysiloxane composition. Such a semiconductor element may comprise a light-emitting semiconductor element or a light-receiving semiconductor element. Typical examples of these semiconductor elements are light-emitting diode (LED) chips having light-generating layers in the form of semiconductor elements of InN, AlN, GaN, ZnSe, SiC, GaP, GaAs, GaAlAs, GaAlN, AlInGaP, InGaN, AlInGaN, etc., formed on respective substrates by growth from a liquid phase or by a MOCVD method. The semiconductor devices of the present invention may be employed, e.g., as surface-mount LEDs. Such LEDs are placed into a recessed case made from a heat-resistant organic resin (e.g., polyphthalamide resin, polyphenylene sulfide resin, or polyethernitrile resin), the case is filled with the aforementioned curable organopolysiloxane composition, and the composition is then cured, thus sealing the aforementioned optical semiconductor element within a transparent cured body. The curable organopolysiloxane composition suitable for the above purpose is one that can form an elastomer that has a hardness of 15 to 50 measured by a type A durometer according to the provisions of JIS K 6253-1997 (Hardness Testing Method for Vulcanized Rubber and Thermoplastic Rubber). When in the course of curing the above composition is in contact with a heat-resistant organic resin, an optical semiconductor element (e.g., LED), inner electrodes (e.g., inner lead wire), bonding wire, etc., then after curing it strongly adheres to the aforementioned elements. An LED embedded in the sealing material may be of a bullet type. Besides an LED, the element may comprise a photocoupler or a CCD element.

Although an LED may be of a bullet type or a surface-mount type, only a surface-type LED is shown in FIG. 1 for illustrative purposes. The device has an inner leads 3, which are laid onto the bottom of polyphthalamide (PPA) case 1, extend from the side walls of the case toward the case center, and an LED chip 2 is placed onto the leads 3 in the center of the case. The LED chip 2 and the inner leads 3 are electrically connected by bonding wires 4. The interior of the PPA case is filled with the curable organopolysiloxane composition of the type described in subsequent application examples, the composition is cured by heating, and is turned into a transparent cured body 5.

The aforementioned curable organopolysiloxane composition may be cured in the semiconductor device of the invention by a method according to which the composition is first cured to an incompletely solidified gel-like state, and the curing is completed by heating to a higher temperature. In other words, curing is carried out in a two-stage process. It is recommended to carry out the first stage of the above process at the lowest temperature that may cause initial curing of the curable organopolysiloxane. In order to reduce development of inner stress during the curing operation, it is recommended that the curing temperature of the first stage do not exceed 100° C. As a result, the curable organopolysiloxane composition turns into a gel and forms a non-flowable cured body. At the second stage the temperature is increased and the process is carried out to completion of curing. In this stage, the curing temperature should be in the range of 120 to 180° C. The second stage of curing can decrease inner stress developed in the course of curing of the composition and makes it possible to further improve adhesion durability and adhesion strength between the cured body of the composition and the organic resin.

EXAMPLES

The adhesion-promoting agent, the curable organopolysiloxane composition, and the semiconductor device of the present invention will be further described in more detail with reference to application and comparative examples. Properties of the curable organopolysiloxane compositions and cured bodies of these compositions were measured by methods described below. Surface-mount LEDs were manufactured by using the aforementioned curable organopolysiloxane, and a peeling ratio was evaluated by the method described below.

Refractive Index of the Curable Organopolysiloxane Composition

Refractive Index of the curable organopolysiloxane was measured by means of an Abbe refractometer at 25° C. A light source emitted visible light of 589 nm n.

Light Transmissivity of a Cured Body of the Curable Organopolysiloxane Composition A curable organopolysiloxane composition was placed between two glass plates and cured by holding for 1 hour at 150° C., and then light transmissivity was measured at 25° C. with the use of an automatic spectrophotometer (optical path length: 0.2 mm) at an arbitrary visible-light wavelength in the range of 400 nm to 700 nm. Light transmissivity of the cured body of the composition was measured as the difference between measurements of transmissivity of light passing through the glass and the cured body and that only passing through the glass. The values of light transmissivity at the wavelength of 450 µm are shown in Table 1.

Hardness of a Cured Body of the Curable Organopolysiloxane Composition

A sheet-like cured body was produced by press-molding the curable organopolysiloxane composition for 1 hour at 150° C. Hardness of the obtained cured body was measured by a type A durometer according to JIS K 6253-1997 (Hardness Testing Method for Vulcanized Rubber and Thermoplastic Rubber).

Tensile Strength and Elongation of a Cured Body of the Curable Organopolysiloxane Composition A cured body of the curable organopolysiloxane composition was made in the form of a dumbbell No. 3 specimen (according to JIS K 6251-1993: "Method of Testing Tensile Strength of Vulcanized Rubber") by press-molding the curable organopolysiloxane composition for 1 hour at 150° C. Tensile strength of the obtained cured body was measured according to the provisions of JIS K 6251-1993.

Tearing Strength of a Cured Body of the Curable Organopolysiloxane Composition

A cured body of the curable organopolysiloxane composition was made in the form of a dumbbell No. 3 specimen (according to JIS K 6252-1993: "Method of Testing Tearing Strength of Vulcanized Rubber") by press-molding the curable organopolysiloxane composition for 1 hour at 150° C. Tearing strength of the obtained cured body was measured according to the provisions of JIS K 6252-1993.

Adhesion of a Cured Body of the Curable Organopolysiloxane Composition to a Polyphthalamide (PFA) Resin Plate A polytetrafluoroethylene spacer (width: 10 mm; length: 20 mm; thickness: 1 mm) was sandwiched between two polyphthalamide (PPA) resin plates (width: 25 mm; length: 50 mm; thickness: 1 mm). The space left between the plates was filled with the curable organopolysiloxane composition, the plates were clipped together, and the composition was cured by holding the package in a hot-air-circulation oven for 1 hour at 150° C. After cooling to room temperature, the clip and the spacer were removed, the aforementioned polyphthalamide (PPA) resin plates were placed into a tensile tester, pulled in opposite horizontal directions, and the stress at the moment of fracture was measured.

Strength of Adhesion of a Cured Body of the Curable Organopolysiloxane Composition to an Aluminum Plate A polytetrafluoroethylene spacer (width: 10 mm; length: 20 mm; thickness: 1 mm) was sandwiched between two aluminum plates (width: 25 mm; length: 75 mm; thickness: 1 mm). The space left between the plates was filled with the curable organopolysiloxane composition, the plates were clipped together, and the composition was cured by holding the package in a hot-air-circulation oven for 1 hour at 150° C. After cooling to room temperature, the clip and the spacer were removed, the aforementioned aluminum resin plates were placed into a tensile tester, pulled in opposite horizontal directions, and the stress at the moment of fracture was measured.

Manufacturing of a Surface-Mount Light-Emitting Diode (LED)

Sixteen LED chips 2 were placed onto the closed bottoms of sixteen cylindrical cases 1 (inner diameter: 2.0 mm; depth: 1.0 mm) made from a polyphthalamide (PPA) resin and having inner leads 3 placed onto the bottom and extending from the side walls toward the center of the cases. In each case, the LED chip 2 and the inner leads 3 were electrically connected by bonding wires 4. Curable organopolysiloxanes of the types used in subsequent application and comparative examples were degassed and injected into the cases of the aforementioned semiproducts through a dispenser, whereby sixteen surface-mount-type light-emitting diodes (LED) of the type shown in FIG. 1 were produced.

Initial Peeling Ratio of the Cured Body

Conditions of the interface between the inner walls of each polyphthalamide (PPA) resin case 1 and the cured body of the aforementioned composition were observed under an optical microscope for all sixteen surface-mount light-emitting diodes (LEDs), and a peeling ratio was determined as a ratio of the number of cases of peeling [i.e., cases wherein the cured body peeled away from the PPA case] to 16.

Peeling Ratio after Holding in a Thermohygrostat

Aforementioned sixteen surface-mount light-emitting diodes (LEDs) were held in a thermostat for 72 hours in 30° C./70 RH % air. Following this, the temperature was returned to 25° C., and conditions of the interface between the inner walls of each polyphthalamide (PPA) resin case 1 and the cured body of the aforementioned composition were observed under an optical microscope for all sixteen surface-mount light-emitting diodes (LEDs), and a peeling ratio was determined as a ratio of the number of peelings [i.e., the number of cases wherein the cured body peeled away from the PPA case] to 16.

Peeling Ratio after Holding for 30 sec. at 280° C.

Aforementioned sixteen surface-mount light-emitting diodes (LEDs) were held in an oven for 30 sec. at 280° C. Following this, the temperature was returned to 25° C., and conditions of the interface between the inner walls of the polyphthalamide (PPA) resin case 1 and the cured body of the aforementioned composition were observed under an optical microscope for all sixteen surface-mount light-emitting diodes (LEDs), and a peeling ratio was determined as a ratio of the number of peelings [i.e., the number of cases wherein the cured body peeled away from the PPA case] to 16.

Peeling Ratio after Thermal Shock Cycle

Aforementioned sixteen surface-mount light-emitting diodes (LEDs) were held in an oven for 30 sec. at 280° C. Following this, the diodes were held for 30 min. at minus 40° C., and then for 30 min. at 100° C. The aforementioned thermal cycle (−40° C.⇆+100° C.) was repeated five times. The temperature was then returned to 25° C., and conditions of the interface between the inner walls of the polyphthalamide (PPA) resin case 1 and the cured body of the aforementioned composition were observed under an optical microscope for all sixteen surface-mount light-emitting diodes (LEDs), and a peeling ratio was determined as a ratio of the number of peelings [i.e., the number of cases wherein the cured body peeled away from the PPA case] to 16.

Application Example 1

A 200 mL-capacity flask equipped with a thermometer, a stirrer, a Dean-Stark tube, and a reflux cooler was filled with argon, and then the following components were loaded into the flask: 50.0 g of 3-glycidoxypropyl trimethoxysilane; 25.0 g of a methylvinylpolysiloxane capped at both molecular terminals with silanol groups and represented by the following average formula:

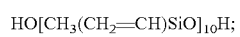

and 25.0 g of 1,3,5,7-tetraphenyl-1,3,5,7-tetramethylcyclotetrasiloxane. While the components were stirred, 0.02 g of potassium hydroxide was added, the mixture was heated, a part of the generated methanol was removed by distillation while the mixture was subjected to refluxing, and the product was held for 1 hour at 130° C. Following this, the product was cooled to room temperature, 0.5 g of a 10 mass % toluene solution of trimethylchlorosilane was added dropwise, and the mixture was stirred for 1 hour. The reaction solution was filtered, methanol, toluene, and low-boiling-point substances were distilled out by heating the filtrate under a reduced pressure, and as a result, 78 g of a transparent lemon-yellow liquid having a viscosity of 25 mPa·s were obtained. This transparent lemon-yellow liquid was subjected to gel-permeation chromatography that showed that the obtained product had mass-average molecular weight of 1,400. $^{13}$C- and $^{29}$Si-MNR spectral analyses confirmed that the product was an organopolysiloxane of the following average unit formula:

$$[CH_3(C_6H_5)SiO_{2/2}]_{0.15}[CH_3(CH_2\!=\!CH)SiO_{2/2}]_{0.24}(EpSiO_{3/2})_{0.19}(CH_3O_{1/2})_{0.42}$$

(where Ep designates a 3-glycidoxypropyl group).
The obtained organopolysiloxane could be represented by the following average formula:

$$R_{2.40}SiO_{0.80},$$

Among all groups designated by R, 11 mole % were phenyl groups, 17 mole % were vinyl groups, 14 mole % were 3-glycidoxypropyl groups, and 30 mole % were methoxy groups. The obtained organopolysiloxane comprised an adhesion-promoting agent (C-1).

Application Example 2

A 200 mL-capacity flask equipped with a thermometer, a stirrer, a Dean-Stark tube, and a reflux cooler was filled with argon, and then the following components were loaded into the flask: 40.0 g of 3-glycidoxypropyl trimethoxysilane; 20.0 g of a methylvinylpolysiloxane capped at both molecular terminals with silanol groups and represented by the following average formula:

$$HO[CH_3(CH_2\!=\!CH)SiO]_{10}H;$$

and 40.0 g of 1,3,5,7-tetraphenyl-1,3,5,7-tetramethylcyclotetrasiloxane. While the components were stirred, 0.02 g of potassium hydroxide was added, the mixture was heated, a part of the generated methanol was removed by distillation while the mixture was subjected to refluxing, and the product was held for 1 hour at 130° C. Following this, the product was cooled to room temperature, 0.4 g of synthetic aluminum silicate was added, and the mixture was stirred for 1 hour. The reaction solution was filtered, methanol, toluene, and low-boiling-point substances were distilled out by heating the filtrate under a reduced pressure, and as a result, 87 g of a transparent lemon-yellow liquid having a viscosity of 33 mPa·s were obtained. This transparent lemon-yellow liquid was subjected to gel permeation chromatography that showed that the obtained product had mass-average molecular weight of 1,150. $^{13}$C- and $^{29}$Si-MNR spectral analyses confirmed that the product was an organopolysiloxane of the following average unit formula:

$$[CH_3(C_6H_5)SiO_{2/2}]_{0.28}[CH_3(CH_2\!=\!CH)SiO_{2/2}]_{0.18}(EpSiO_{3/2})_{0.17}(CH_3O_{1/2})_{0.37}$$

(where Ep designates a 3-glycidoxypropyl group).
The obtained organopolysiloxane could be represented by the following average formula:

$$R_{2.32}SiO_{0.84},$$

Among all groups designated by R, 19 mole % were phenyl groups, 12 mole % were vinyl groups, 12 mole % were 3-glycidoxypropyl groups, and 25 mole % were methoxy groups. The obtained organopolysiloxane comprised an adhesion-promoting agent (C-2).

Application Example 3

A 200 mL-capacity flask equipped with a thermometer, a stirrer, a Dean-Stark tube, and a reflux cooler was filled with argon, and then the following components were loaded into the flask: 50.0 g of 3-glycidoxypropyl trimethoxysilane; 25.0 g of a methylvinylpolysiloxane capped at both molecular terminals with silanol groups and represented by the following average formula:

$$HO[CH_3(CH_2\!=\!CH)SiO]_{10}H;$$

and 25.0 g of octaphenylcyclotetrasiloxane. While the components were stirred, 0.02 g of potassium hydroxide was added, the mixture was heated, a part of the generated methanol was removed by distillation while the mixture was subjected to refluxing, and the product was held for 1 hour at 130° C. Following this, the product was cooled to room temperature, 0.04 g of an acetic acid was added dropwise, and the mixture was stirred for 1 hour. The reaction solution was filtered, methanol, toluene, acetic acid, and low-boiling-point substances were distilled out by heating the filtrate under a reduced pressure, and as a result, 60 g of a transparent lemon-yellow liquid having a viscosity of 300 mPa·s were obtained. This transparent lemon-yellow liquid was subjected to gel permeation chromatography that showed that the obtained product had mass-average molecular weight of 1,300. $^{13}$C- and $^{29}$Si-MNR spectral analyses confirmed that the product was an organopolysiloxane of the following average unit formula:

$$[(C_6H_5)_2SiO_{2/2}]_{0.28}[CH_3(CH_2\!=\!CH)SiO_{2/2}]_{0.18}(EpSiO_{3/2})_{0.17}(CH_3O_{1/2})_{0.37}$$

(where Ep designates a 3-glycidoxypropyl group).
The obtained organopolysiloxane could be represented by the following average formula:

$$R_{2.32}SiO_{0.84}$$

Among all groups designated by R, 38 mole % were phenyl groups, 12 mole % were vinyl groups, 12 mole % were 3-glycidoxypropyl groups, and 25 mole % were methoxy groups. The obtained organopolysiloxane comprised an adhesion-promoting agent (C-3).

Comparative Example 1

A 200 mL-capacity flask equipped with a thermometer, a stirrer, a Dean-Stark tube, and a reflux cooler was filled with argon, and then the following components were loaded into the flask: 56.5 g of 3-glycidoxypropyl trimethoxysilane; 16.0 g of a dimethylpolysiloxane capped at both molecular terminals with silanol groups and represented by the following average formula:

$$HO[(CH_3)_2SiO]_7H;$$

and 27.5 g of 1,3,5,7-tetramethyl-1,3,5,7-tetravinyl cyclotetrasiloxane. While the components were stirred, 0.02 g of potassium hydroxide was added, the mixture was heated, a part of the generated methanol was removed by distillation while the mixture was subjected to refluxing, and the product was held for 1 hour at 130° C. Following this, the product was cooled to room temperature, 0.5 g of 10 mass % toluene solution of trimethylchlorosilane was added dropwise, and the mixture was stirred for 1 hour. The reaction solution was filtered, methanol, toluene, and low-boiling-point substances were distilled out by heating the filtrate under a reduced pressure, and as a result, 80 g of a transparent lemon-yellow liquid having a viscosity of 28 mPa·s were obtained. This transparent lemon-yellow liquid was subjected to gel permeation chromatography that showed that the obtained product had mass-average molecular weight of 1,100. $^{13}$C- and $^{29}$Si-MNR spectral analyses confirmed that the product was an organopolysiloxane of the following average unit formula:

[(CH$_3$)$_2$SiO$_{2/2}$]$_{0.15}$[CH$_3$(CH$_2$=CH)SiO$_{2/2}$]$_{0.24}$(EpSiO$_{3/2}$)$_{0.19}$(CH$_3$O$_{1/2}$)$_{0.42}$ (where Ep designates a 3-glycidoxypropyl group).
The obtained organopolysiloxane could be represented by the following average formula:

R$_{2.40}$SiO$_{0.80}$

Among all groups designated by R, 17 mole % were vinyl groups, 14 mole % were 3-glycidoxypropyl groups, and 30 mole % were methoxy groups. The obtained organopolysiloxane comprised an adhesion-promoting agent (C-4).

Comparative Example 2

A 200 mL-capacity flask equipped with a thermometer, a stirrer, a Dean-Stark tube, and a reflux cooler was filled with argon, and then the following components were loaded into the flask: 49.0 g of 3-glycidoxypropyl trimethoxysilane; 27.5 g of a dimethylvinylpolysiloxane capped at both molecular terminals with silanol groups and represented by the following average formula:

HO[(CH$_3$)$_2$SiO]$_7$H;

and 23.5 g of 1,3,5,7-tetramethyl-1,3,5,7-tetravinyl cyclotetrasiloxane. While the components were stirred, 0.02 g of potassium hydroxide was added, the mixture was heated, a part of the generated methanol was removed by distillation while the mixture was subjected to refluxing, and the product was held for 1 hour at 130° C. Following this, the product was cooled to room temperature, 0.4 g of synthetic aluminum silicate was added, and the mixture was stirred for 1 hour. The reaction solution was filtered, methanol, toluene, and low-boiling-point substances were distilled out by heating the filtrate under a reduced pressure, and as a result, 75 g of a transparent lemon-yellow liquid having a viscosity of 22 mPa·s were obtained. This transparent lemon-yellow liquid was subjected to gel permeation chromatography that showed that the obtained product had mass-average molecular weight of 950. $^{13}$C- and $^{29}$Si-MNR spectral analyses confirmed that the product was an organopolysiloxane of the following average unit formula:

[(CH$_3$)$_2$SiO$_{2/2}$]$_{0.28}$[CH$_3$(CH$_2$=CH)SiO$_{2/2}$]$_{0.18}$(EpSiO$_{3/2}$)$_{0.17}$(CH$_3$O$_{1/2}$)$_{0.37}$ (where Ep designates a 3-glycidoxypropyl group).
The obtained organopolysiloxane could be represented by the following average formula:

R$_{2.32}$SiO$_{0.84}$

Among all groups designated by R, 12 mole % were vinyl groups, 12 mole % were 3-glycidoxypropyl groups, and 25 mole % were methoxy groups. The obtained organopolysiloxane comprised an adhesion-promoting agent (C-5).

Application Examples 4 to 7

Comparative Examples 3 to 5

Curable organopolysiloxane compositions were prepared by mixing components shown in Table 1 below and used in parts-by-mass quantities given in the table. The obtained compositions were evaluated in regard to properties of cured bodies obtained from these compositions and characteristics of surface-mount diodes (LEDs) produced by using the aforementioned compositions. The results of the evaluation are shown in Table 1.

Designations used in Table 1 correspond to the following compounds:
(A-1): methylphenylpolysiloxane having viscosity of 1,000 mPa·s at 25° C. and represented by the following average formula:

[(CH$_3$)$_2$(CH$_2$=CH)SiO[CH$_3$(C$_6$H$_5$)SiO]$_{30}$Si(CH$_3$)$_2$(CH=CH$_2$)

(average unit formula: R$_{2.06}$Si$_{0.96}$; 45 mole % of all groups designated by R are phenyl groups);
(A-2): methylphenylpolysiloxane having viscosity of 15,000 mPa·s at 25° C. and represented by the following average formula:

(CH$_3$)$_2$(CH$_2$=CH)SiO[CH$_3$(C$_6$H$_5$)SiO]$_{120}$Si(CH$_3$)$_2$(CH=CH$_2$)

(average unit formula: R$_{2.02}$SiO$_{0.99}$; 49 mole % of all groups designated by R are phenyl groups);
(A-3): organopolysiloxane having mass-average molecular weight of 2,400, which is a toluene-soluble white substance, solid at 25° C., and represented by the following average formula:

(C$_6$H$_5$SiO$_{3/2}$)$_{0.75}$[(CH$_3$)$_2$(CH$_2$=CH)SiO$_{1/2}$]$_{0.25}$ (average unit formula: R$_{1.5}$SiO$_{1.25}$; 50 mole % of all groups designated by R are phenyl groups);
(A-4): organopolysiloxane having a mass-average molecular weight of 7,700 and viscosity of 100,000 Pa·s at 25° C. and represented by the following average formula:

(C$_6$H$_5$SiO$_{3/2}$)$_{0.75}$[(CH$_3$)$_2$(CH$_2$=CH)SiO$_{1/2}$]$_{0.10}$[(CH$_3$)$_2$SiO$_{2/2}$]$_{0.15}$ (average unit formula: R$_{1.35}$SiO$_{1.325}$; 56 mole % of all groups designated by R are phenyl groups);
(B-1): organopolysiloxane having viscosity of 1.7 mPa·s at 25° C. and represented by the following average formula:

[(CH$_3$)$_2$HSiO]$_3$Si(C$_6$H$_5$)

(average unit formula: R$_{1.75}$H$_{0.75}$SiO$_{0.75}$; 14 mole % of all groups designated by R are phenyl groups);
(B-2): organopolysiloxane having viscosity of 4.0 mPa·s at 25° C. and represented by the following average formula:

H(CH$_3$)$_2$SiO(C$_6$H$_5$)$_2$SiOSi(CH$_3$)$_2$H (average unit formula: R$_{2.0}$H$_{0.67}$SiO$_{0.67}$; 33 mole % of all groups designated by R are phenyl groups);
(B-3): organopolysiloxane having mass-average molecular weight of 1,000 and viscosity of 750 mPa·s at 25° C. and represented by the following average formula:

(C$_6$H$_5$SiO$_{3/2}$)$_{0.60}$[H(CH$_3$)$_2$SiO$_{1/2}$]$_{0.40}$ (average unit formula: R$_{1.40}$H$_{0.40}$SiO$_{1.10}$; 43 mole % of all groups designated by R are phenyl groups);
(C-1): adhesion-promoting agent prepared in Application Example 1;
(C-2): adhesion-promoting agent prepared in Application Example 2;
(C-3): adhesion-promoting agent prepared in Application Example 3;
(C-4): adhesion-promoting agent prepared in Comparative Example 1;
(C-5): adhesion-promoting agent prepared in Comparative Example 2;
(D-1): platinum complex of 1,3-divinyltetramethyldisiloxane;
(E-1): 2-phenyl-3-butyn-2-ol

TABLE 1

| | | Application Examples | | | | Comparative Examples | | |
|---|---|---|---|---|---|---|---|---|
| Items | | 1 | 2 | 3 | 4 | 1 | 2 | 3 |
| Content of Curable Organopolysiloxane Composition | (A-1) parts by mass | 11.15 | 11.15 | — | — | 11.15 | 11.15 | — |
| | (A-2) parts by mass | 41.25 | 41.25 | 52 | 52 | 41.25 | 41.25 | 52 |
| | (A-3) parts by mass | 33.75 | 30.75 | 20 | 20 | 33.75 | 33.75 | 20 |
| | (A-4) parts by mass | — | 3.00 | — | — | — | — | — |
| | (B-1) parts by mass | 1.00 | 1.00 | 1 | 1 | 1.00 | 1.00 | 1 |
| | (B-2) parts by mass | 11.75 | 13.0 | 4 | 4 | 11.75 | 11.75 | 4 |
| | (B-3) parts by mass | — | — | 10 | 10 | — | — | 10 |
| | (C-1) parts by mass | 0.10 | 0.50 | — | — | — | — | — |
| | (C-2) parts by mass | — | — | 1 | — | — | — | — |
| | (C-3) parts by mass | — | — | — | 1.5 | — | — | — |
| | (C-4) parts by mass | — | — | — | — | — | 0.5 | — |
| | (C-5) parts by mass | — | — | — | — | 0.1 | — | 1.5 |
| | (D-1) | In all compositions, in terms of mass units, this constituent contained 2.5 ppm of platinum atoms | | | | | | |
| | (E-1) | In terms of mass units, the content of this constituent in all compositions was 50 ppm | | | | | | |
| Composition | SiH/Vi* | 0.7 | 0.8 | 1.5 | 1.5 | 0.7 | 0.7 | 1.5 |
| | Viscosity (mPa·s) | 11000 | 12000 | 12000 | 10000 | 8500 | 8000 | 9000 |
| Cured body | Refractive Index | 1.53 | 1.53 | 1.53 | 1.53 | 1.53 | 1.53 | 1.53 |
| | Transmissivity (%) | 99 | 99 | 98 | 98 | 99 | 98 | 96 |
| | Hardness | 24 | 25 | 35 | 40 | 28 | 28 | 47 |
| | Tensile strength (kgf/cm²) | 4.5 | 3.5 | 4.5 | 5.0 | 5.0 | 4.0 | 4.0 |
| | Elongation (%) | 70 | 70 | 64 | 45 | 65 | 70 | 25 |
| | Resistance to grinding (kgf/cm²) | 3.5 | 2.5 | 3.5 | 3.5 | 3.2 | 2.3 | 2.5 |
| Curing conditions | First curing temperature (° C.) | 60 | 60 | 60 | 60 | 110 | 80 | 110 |
| | Second curing temperature (° C.) | 150 | 150 | 150 | 150 | 150 | 150 | 150 |
| Peeling Ratio | Initial, after curing | 0/16 | 0/16 | 0/16 | 0/16 | 8/16 | 5/16 | 0/16 |
| | After holding at high temperature and humidity | 0/16 | 0/16 | 0/16 | 0/16 | 10/16 | 7/16 | 0/16 |
| | After 280° C./30 sec. | 0/16 | 0/16 | 0/16 | 0/16 | 14/16 | 13/16 | 3/16 |
| | After thermal shock cycle | 0/16 | 0/16 | 0/16 | 0/16 | 16/16 | 15/16 | 14/16 |

*The total mole number of silicon-bonded hydrogen atoms of constituents (B-1) to (B-3) to total 1 mole of vinyl groups contained in components (A-1) to (A-4)

INDUSTRIAL APPLICABILITY

The adhesion-promoting agent of the present invention is suitable for use with curable organopolysiloxane compositions, especially with hydrosilylation-curable organopolysiloxane compositions. The curable organopolysiloxane composition of the invention is characterized by excellent initial adhesion and adhesion durability, and therefore may find application as an adhesive agent, bonding agent, protective coating agent, underfiller, etc. in conjunction with electronic instruments, electronic components, electrical instruments, electrical components, etc. In particular, since a cured body of the composition has is characterized by high refractive index and high light transmissivity, the composition may be used as a sealant, adhesive agent, bonding agent, coating agent, undefiller, etc. for optical semiconductor elements and other parts of optical semiconductors. The semiconductor device of the invention is suitable for use in LED displays, or the like.

The invention claimed is:

1. A curable organopolysiloxane composition comprising at least the following components:

100 parts by weight of an organopolysiloxane (A) of the following average formula:

$$R^2{}_b SiO_{(4-b)/2}$$

(where $R^2$ is an optionally substituted univalent hydrocarbon group with 1 to 10 carbon atoms; however, in one molecule, at least two $R^2$'s are univalent hydrocarbon groups having unsaturated aliphatic bonds; at least 20 mole % of all $R^2$'s are aryl groups; and "b" is a number that satisfies the following condition: $0.5 \leq b \leq 2.2$);

an organohydrogenpolysiloxane (B) of the following average formula:

$$R^3{}_c H_d SiO_{(4-c-d)/2}$$

(where $R^3$ is an optionally substituted univalent hydrocarbon group having 1 to 10 carbon atoms and free of unsaturated aliphatic bonds, and where "c" and "d" are numbers that satisfy the following conditions: $1.0 < c < 2.2$; $0.002 < d < 1$; and $1.0 < c+d < 3.0$)

wherein component (B) is contained in such an amount that the mole ratio of silicon-bonded hydrogen atoms contained in this component to univalent hydrocarbon groups with unsaturated aliphatic bonds contained in component (A) is in the range of 0.3 to 5;

0.01 to 50 parts by weight of an adhesion-promoting agent (C) represented by the following average formula:

$$R^1{}_a SiO_{(4-a)/2}$$

(where $R^1$ is a group selected from an optionally substituted alkyl group with 1 to 10 carbon atoms, an alkenyl group with 2 to 20 carbon atoms, an aryl group with 6 to 20 carbon atoms, an alkoxy group with 1 to 10 carbon atoms, or an epoxy-containing organic group; however, in one molecule, the content of alkenyl groups constitute at least 5 mole % of all groups designated by $R^1$; the content of aryl groups constitute at least 5 mole % of all groups designated by $R^1$; the content of alkoxy groups constitute at least 5 mole % of all groups designated by $R^1$; the content of epoxy-containing organic groups constitute at least 5 mole % of all groups designated by $R^1$; and "a" is a number that satisfies the following condition: $2.2 \leq a < 2.6$); and a hydrosilylation catalyst (D) in a catalytic quantity.

2. The curable organopolysiloxane composition of claim 1, wherein component (A) is a mixture of
30 to 99 mass % of an organopolysiloxane ($A_1$) represented by the following average formula:

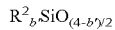
$$R^2_{b'}SiO_{(4-b')/2}$$

(where $R^2$ is an optionally substituted univalent hydrocarbon group with 1 to 10 carbon atoms; however, in one molecule, at least two groups designated by $R^2$ are univalent hydrocarbon groups having unsaturated aliphatic bonds; at least 20 mole % of all $R^2$'s are aryl groups; and "b'" is a number that satisfies the following condition:
$1.9 \leq b' \leq 2.2$), and
1 to 70 mass % of an organopolysiloxane ($A_2$) of the following average formula:

$$R^2_{b''}SiO_{(4-b'')/2}$$

(where $R^2$ is the same as defined above, and "b''" is a number that satisfies the following condition: $0.5 \leq b'' \leq 1.7$).

3. The curable organopolysiloxane composition of claim 1, wherein at least 20 mole % of $R^3$'s contained in one molecule of component (B) are aryl groups.

4. The curable organopolysiloxane composition of claim 1, wherein the content of alkenyl groups which have 2 to 20 carbon atoms and are contained in component (C) constitutes 5 to 50 mole % of all $R^1$'s contained in one molecule.

5. The curable organopolysiloxane composition of claim 1, wherein a content of aryl groups which have 6 to 20 carbon atoms and are contained in component (C) constitutes at least 10 mole % of all $R^1$'s contained in one molecule.

6. The curable organopolysiloxane composition of claim 1, wherein a content of epoxy-containing organic groups contained in component (C) constitutes 5 to 50 mole % of all $R^1$'s contained in one molecule.

7. The curable organopolysiloxane composition of claim 1, wherein the epoxy-containing organic groups are glycidoxyalkyl groups, epoxycyclohexylalkyl groups, or oxiranylalkyl groups.

8. A semiconductor device having semiconductor elements sealed with a cured body of the curable organopolysiloxane composition according to claim 1.

9. The semiconductor device of claim 8, wherein the semiconductor elements are light-emitting elements.

* * * * *